(12) United States Patent
Huang et al.

(10) Patent No.: US 8,048,764 B2
(45) Date of Patent: Nov. 1, 2011

(54) DUAL ETCH METHOD OF DEFINING ACTIVE AREA IN SEMICONDUCTOR DEVICE

(75) Inventors: Ming-Jie Huang, Hsin-Chu (TW);
Chen-Ping Chen, Yilan (TW);
Tung-Ying Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 12/570,926

(22) Filed: Sep. 30, 2009

(65) Prior Publication Data
US 2011/0076832 A1    Mar. 31, 2011

(51) Int. Cl.
*H01L 21/76* (2006.01)
(52) U.S. Cl. .......................................................... 438/425
(58) Field of Classification Search .................... 438/425
See application file for complete search history.

(56) References Cited

U.S. PATENT DOCUMENTS

| | | | |
|---|---|---|---|
| 5,308,741 A * | 5/1994 | Kemp | 430/312 |
| 5,916,733 A * | 6/1999 | Koyama | 430/296 |
| 6,121,155 A | 9/2000 | Yang et al. | |
| 6,197,687 B1 | 3/2001 | Buynoski | |
| 6,204,133 B1 | 3/2001 | Yu et al. | |
| 6,283,131 B1 | 9/2001 | Chen et al. | |
| 6,420,097 B1 | 7/2002 | Pike et al. | |
| 6,482,726 B1 | 11/2002 | Aminpur et al. | |
| 6,580,110 B2 | 6/2003 | Schrems | |
| 7,115,450 B2 | 10/2006 | Huang et al. | |
| 2002/0045136 A1* | 4/2002 | Fritze et al. | 430/322 |
| 2002/0081854 A1 | 6/2002 | Morrow et al. | |
| 2005/0164478 A1 | 7/2005 | Chan et al. | |
| 2005/0269602 A1* | 12/2005 | Maruyama et al. | 257/288 |
| 2009/0081563 A1* | 3/2009 | Wang et al. | 430/5 |
| 2010/0176479 A1* | 7/2010 | Postnikov et al. | 257/499 |

* cited by examiner

*Primary Examiner* — N Drew Richards
*Assistant Examiner* — Grant Withers
(74) *Attorney, Agent, or Firm* — Duane Morris LLP

(57) ABSTRACT

A method of forming a hardmask for defining shallow trench isolation regions in a semiconductor substrate layer includes the steps of: depositing a hardmask layer over the semiconductor substrate layer; depositing and patterning a first photoresist layer over the hardmask layer; etching the hardmask layer after patterning the first photoresist layer to form an interim hardmask layer having at least one line feature; depositing and patterning a second photoresist layer over the interim hardmask layer; and forming a hardmask, the forming step including etching the interim hardmask layer after patterning the second photoresist layer to define a line end of the at least one line feature.

20 Claims, 11 Drawing Sheets

301

301

DUAL ETCH METHOD OF DEFINING ACTIVE AREA IN SEMICONDUCTOR DEVICE

FIELD OF THE INVENTION

The present invention relates to semiconductor devices, and more specifically to etch transferring a pattern into a substrate during formation of shallow trench isolations.

BACKGROUND OF THE INVENTION

It is desirable to make transistors as small as possible so that more can be put on a given size integrated circuit die. This allows ever more complex circuits to be made and more economically as linewidths decrease.

Designers have encountered difficulties as linewidths and design rules have shrunken to the sub-100 nanometer (nm) region, such as to the 45-nanometer and 22-nanometer generations. For example, it has become increasingly more difficult to meet line end shortening targets and thus line end bias (LE)-to-line side bias (LS) ratio targets for hardmasks that are used in etch processes to define shallow trench isolation (STI) regions that frame the active areas in the semiconductor substrate.

The traditional method of defining shallow trench isolation regions in a semiconductor substrate is described in connection with FIGS. 1A-1D. FIG. 1A is a side view of a portion of a semiconductor wafer during processing. A blanket layer of hardmask material 20 is formed over the semiconductor substrate 10. A layer of photoresist material is then deposited over the blanket layer of hardmask material 20, exposed to a patterned light source, and developed to form a patterned photoresist layer 30 for defining active regions and isolation regions surrounding the active regions (i.e., the OD region).

FIG. 1B is a top view of the structure illustrated in FIG. 1B. As shown in FIG. 1B, the patterned photoresist layer 30 generally define lines having line side widths "a" and that are separated by a line end distance "b."

FIG. 1C is a top down view of the structure after etching the hardmask layer 20 through the patterned photoresist layer 30 and subsequent etching of the semiconductor substrate 10 through the etched hardmask layer 20a to form etched substrate 10a. FIG. 1C shows that the individual line features formed in the etched hardmask layer 20a, as defined by the patterned photoresist layer 30, have line side widths "c" that differ from the line side widths "a" of the corresponding features of the developed, patterned photoresist layer 30. More specifically, the line side widths "c" of the features of the etched hardmask layer 20a are less than the widths "a" of the corresponding features of the patterned photoresist layer 30. Also, as illustrated in FIG. 1C, the distance "d" between the line ends of the features of the etched hardmask layer 20a is greater than the distance "b" defined by the patterned photoresist layer 30. These distances "b" and "d" are typically taken at the bottom of the features.

FIG. 1D is a side view of the structure of FIG. 1C. As can be seen in FIG. 1D, the portions of the semiconductor substrate protected by the etched hardmask layer 20a form active regions 50 in the etched semiconductor substrate 10a. The unprotected areas of the semiconductor substrate have been etched to form trenches 40 for forming shallow trench isolations, i.e., the oxide-defined (OD) area.

The line end (LE) critical dimension bias difference, defined as "d"–"b", and the lines side (LS) critical dimension bias difference, defined as "a"–"c", are of critical importance in the design of the device. For newer technology generations, e.g., 22 nm design generations, the LE/LS ratio target is less than 1. That is, the target calls for less difference in the line end (LE) shortening than in the line side (LS) shortening. These new generations also call for closer spacing between lines ends and thus tighter tolerances on line end (LE) shortening. For example, the 22 nm generation has a LE shortening target difference of less than 5 nm. Meeting these targets is critical, for example, to ensure proper location of subsequently formed contacts to the device region. Excessive shortening of the line ends of hardmask can result in contacts being formed to the OD region rather than to the device region.

It has proven difficult to meet the targets of these newer generations with the prior art method described above in connection with FIGS. 1A-1D. Further, regardless of whether the illustrated prior art method could meet these targets, the prior art method also suffers from design rule difficulties in so much as the single photolithography/single etch approach to defining both the line side and line end features of the hardmask makes it difficult to adapt the fabrication processes to multiple mask designs, such as mask designs from the same or different customers.

Improved techniques for forming hardmasks for defining the STI-defined regions are desired.

SUMMARY OF THE INVENTION

A method of forming a hardmask for defining shallow trench isolation regions in a semiconductor substrate layer includes the steps of: depositing a hardmask layer over the semiconductor substrate layer; depositing and patterning a first photoresist layer over the hardmask layer; etching the hardmask layer after patterning the first photoresist layer to form an interim hardmask layer having at least one line feature; depositing and patterning a second photoresist layer over the interim hardmask layer; and forming a hardmask, the forming step including etching the interim hardmask layer after patterning the second photoresist layer to define a line end of the at least one line feature.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1A:
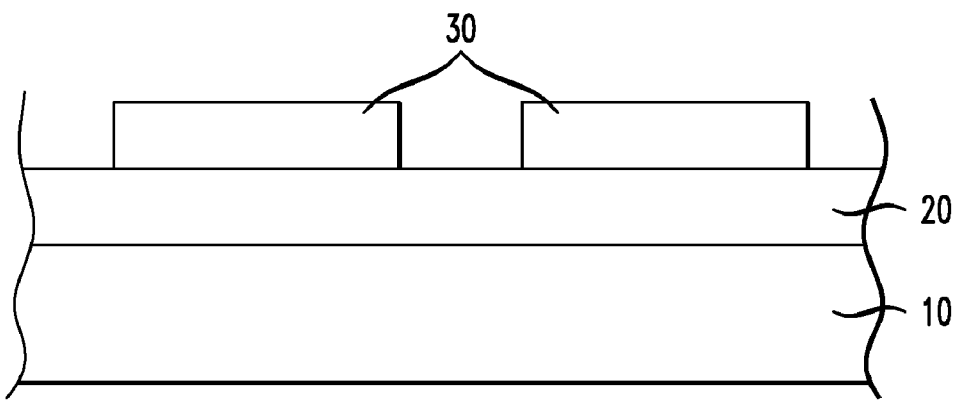
FIGS. 1A-1D illustrate a prior art method of forming trenches that correspond to shallow trench isolation regions in a semiconductor substrate.
Figure 1B:
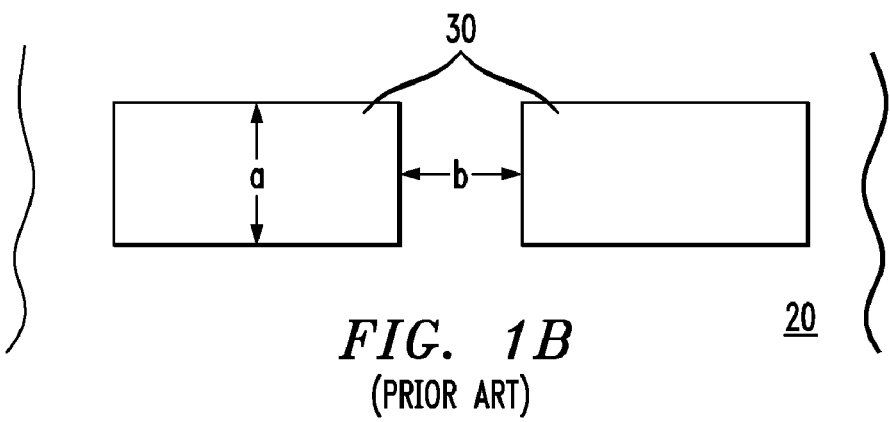
Figure 1C:
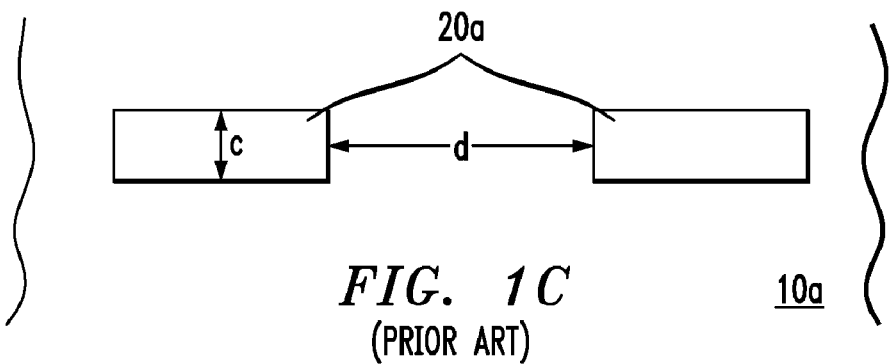
Figure 1D:
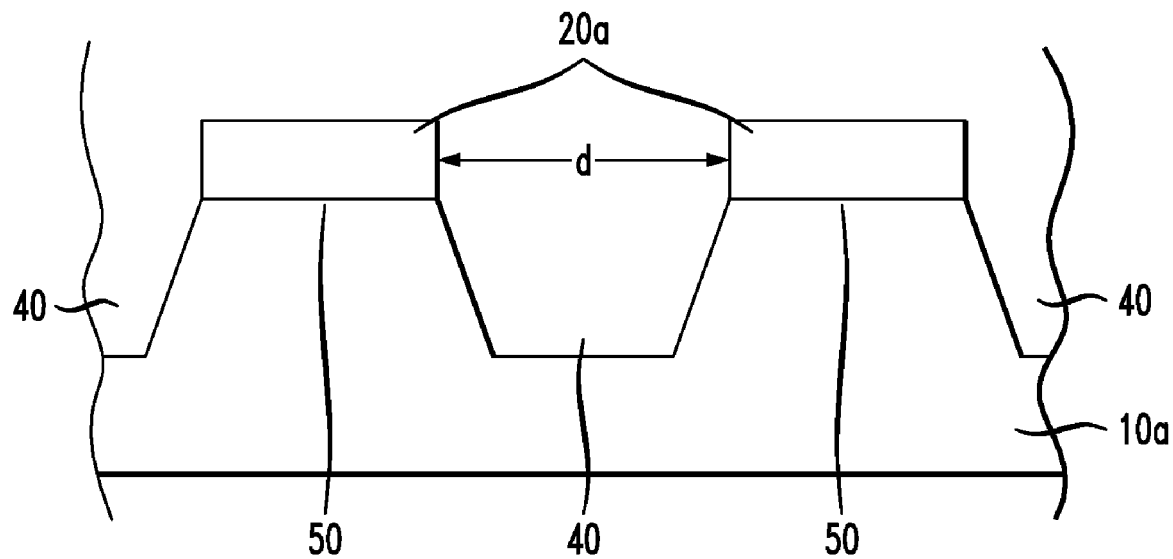

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An improved method of forming a hardmask layer for defining shallow trench isolation (STI) regions in a semiconductor substrate layer is described below in connection with the illustrations of FIGS. 2A-2N. Specific process parameters, etchants, chemistries, materials and the like for implementing this process will be familiar to those in the art of lithography, and specifically those familiar with the prior art process described above in connection with 1A-1D, and are not repeated herein so as to avoid obscuring the details of the present invention.

Figure 2A:
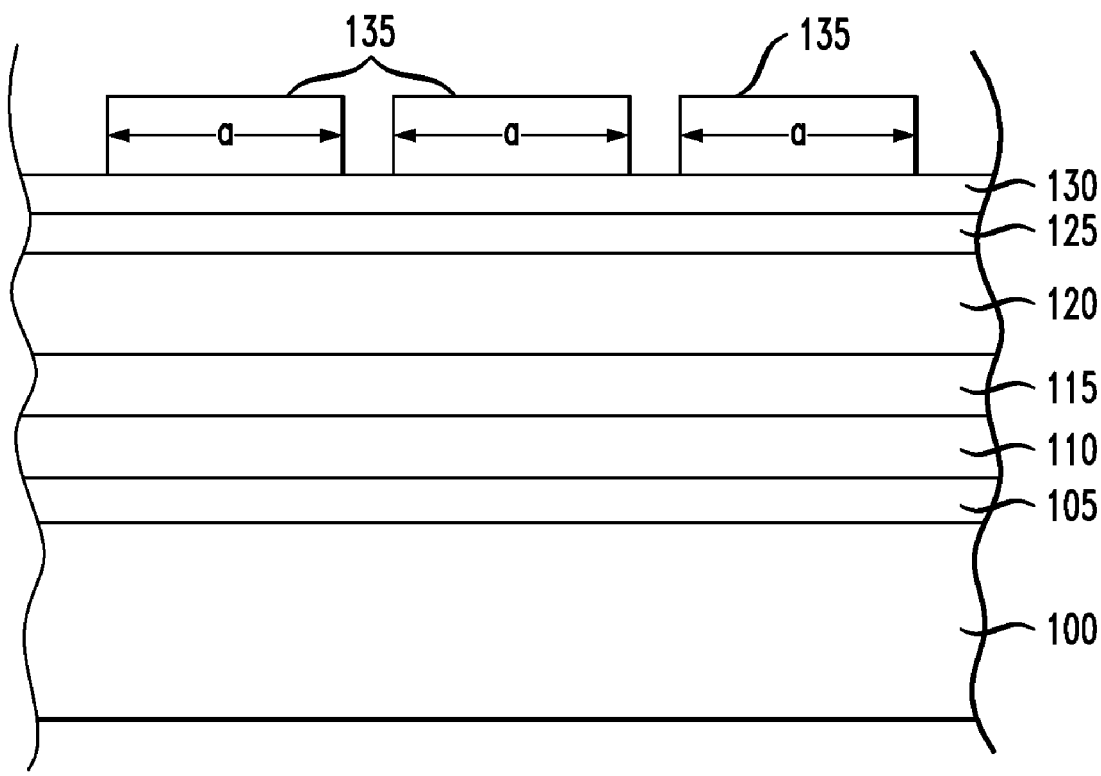
FIGS. 2A-2N illustrate a method of forming shallow trench isolation regions in accordance with one embodiment of the present invention.

FIG. 2A is a side elevation view of a semiconductor structure. The structure includes a semiconductor substrate 100 (e.g., silicon wafer). A stack of layers used in forming a hardmask for use in etch transferring a defined active area/OD region pattern into the semiconductor substrate 100 is formed over the semiconductor substrate 100. The stack of layers includes a pad oxide layer 105 (e.g., 90 Å in thickness) formed on the semiconductor substrate 100. A hardmask structure, including, for example, a layer of SiN 110 (e.g., 800 Å in thickness) and a layer of PEOX 115 (e.g., 630 Å in thickness), is formed over the pad oxide layer 105. As will be familiar to those in the art of semiconductor photolithography, various other layers helpful in the accurate formation of the patterned photosensitive layer may be deposited over the hardmask stack 110, 115 including advanced pattern film (APF) layer 120 (e.g., 1200 Å in thickness), SiON layer 125 (e.g., 200 Å in thickness) and bottom antireflective coating (BARC) layer 130 (e.g., 550 Å in thickness). APF layer 120 contains C and H and can be removed by an $O_2$ ashing process. Finally, a layer of photosensitive material, such as a photoresist, is spin-coated over the BARC layer 130 and patterned using conventional methods to form a patterned photoresist layer 135 having line features having defined line side (LS) width dimensions.

The processes for formation of patterned photoresist layer 135 need not be detailed herein as they are familiar to those of ordinary skill in this art. In general, after a prebaking step, the photoresist layer is exposed to a pattern of ultraviolet light. Positive photoresist, the most common type, becomes soluble in the basic developer when exposed; negative photoresist becomes insoluble in the (organic) developer. This chemical change allows some of the photoresist to be removed by a special solution, called "developer." A PEB (post-exposure bake) step is performed before developing, typically to help reduce problems associated with interference patterns of the incident light. In DUV (deep ultraviolet, or 248 nm exposure wavelength) lithography, CAR (chemically amplified resist) chemistry is used. This process is much more sensitive to PEB time, temperature, and delay, as most of the "exposure" reaction actually occurs in the PEB. After development, the resulting wafer is then "hard-baked" if a non-chemically amplified resist was used, typically at 120 to 180° C. for 20 to 30 minutes. The hard bake solidifies the remaining photoresist, to make a more durable protecting layer for use in subsequent etching steps.

Figure 2B:
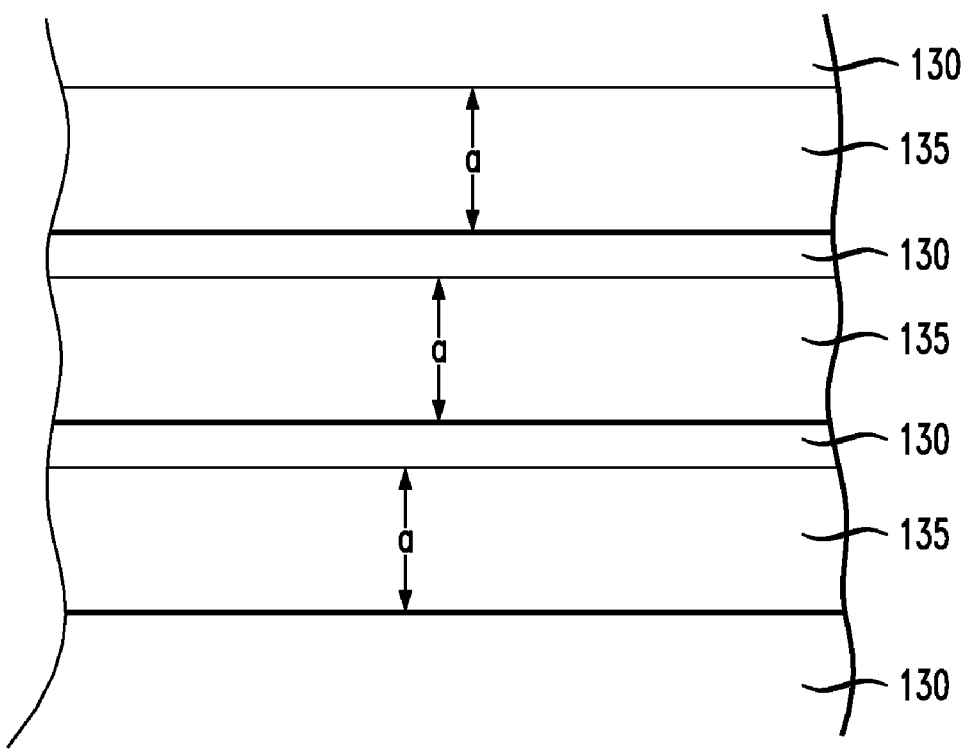

FIG. 2B is a top down view of the structure of FIG. 2A. As can be seen from FIG. 2A, the photoresist pattern 135 includes several spaced elongated lines of photoresist, each having an after development inspection (ADI) LS width "a."

Figure 2C:
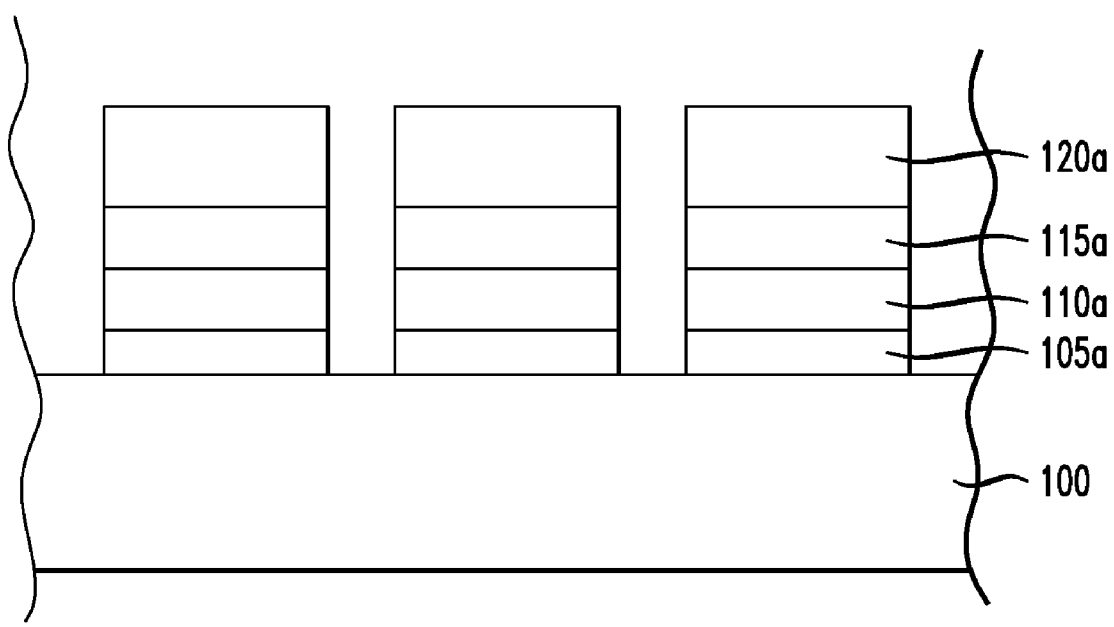

As illustrated in FIG. 2C, a first etch process is performed to transfer etch the pattern set forth in patterned photoresist layer 135 to the stack of layers. Dry etching techniques are generally preferred, as they can be made anisotropic, in order to avoid significant undercutting of the photoresist pattern. This is essential when the width of the features to be defined is similar to or less than the thickness of the material being etched (i.e., when the aspect ratio approaches unity).

After the etching process, the APF, SiON, BARC and photoresist layers 120, 125, 130, 135 are no longer needed and are removed, such as by liquid "resist stripper", which chemically alters the layers so that they no longer adhere to the substrate, or by a plasma containing oxygen, which oxidizes it. This oxidizing process is called ashing, and resembles dry etching.

Figure 2D:
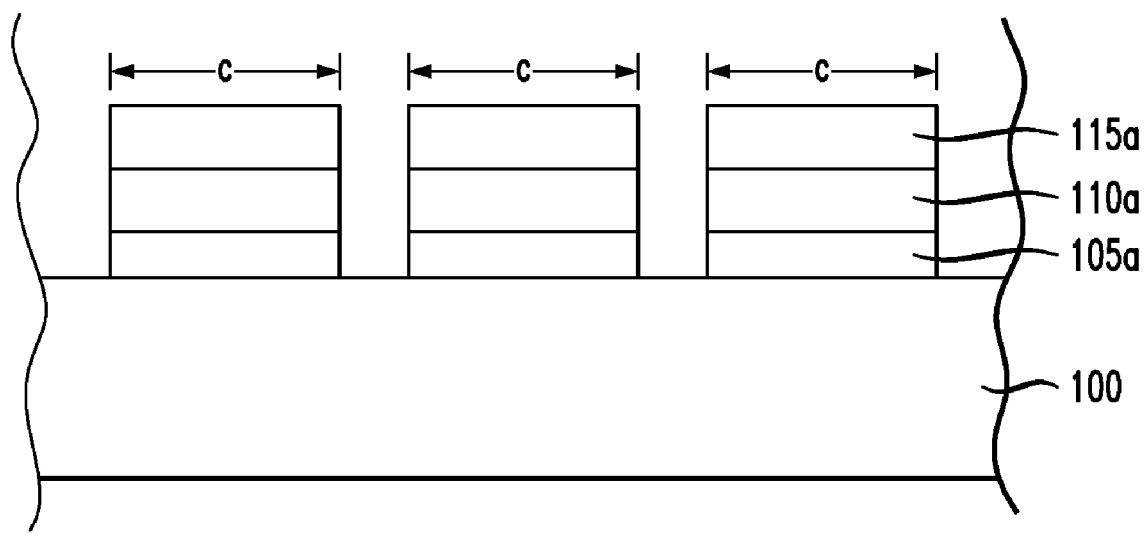

FIG. 2C shows that the SiON, BARC and photoresist layers 125, 130 and 135 have been removed, such as by a dry etch process during the etch of the APF layer 120, leaving only etched layers 105a, 110a, 115a and 120a. As shown in FIG. 2D, the APF layer 120a is then removed, such as by $O_2$ ashing. The resultant structure provides an interim patterned hardmasks formed from layers 110a and 115a. The interim patterned hardmask has line features with an after etch inspection (AEI) LS width "c" labeled on FIG. 2D.

Figure 2E:
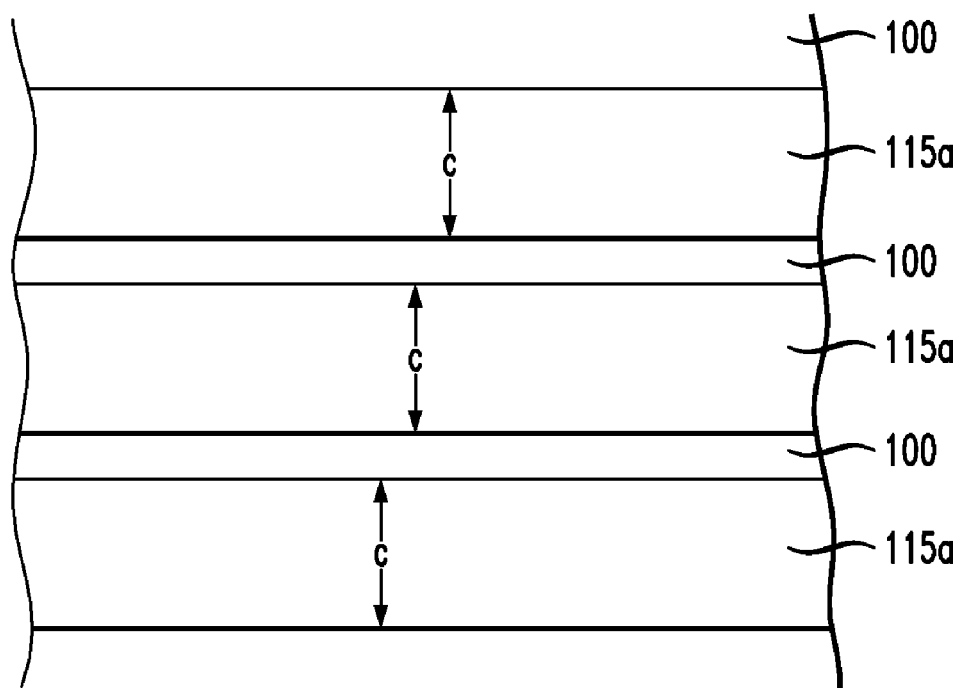

FIG. 2E is a top down view of the structure shown in FIG. 2D. Unlike the prior art methodology described above in connection with FIGS. 1A-1D, which simultaneously defines both the line side and line end characteristics of the hard mask features, as can be seen in FIG. 2E the etch process defines only the line width of the line features of the hardmask but not the line ends of those features. Rather than define the lines sides and the line ends of the various regions of the hardmask in a single photolithography/etch sequence, as is done in the prior art method of FIGS. 1A-1D, as described below, the ends of the individual regions of the hardmask are defined by a second photolithography and etch process. With the line sides of the various regions of the hardmask already defined, a second photoresist structure is used to pattern the hardmask layer to cut the hardmask lines to define the line ends of the line features of the hardmask regions.

Figure 2F:
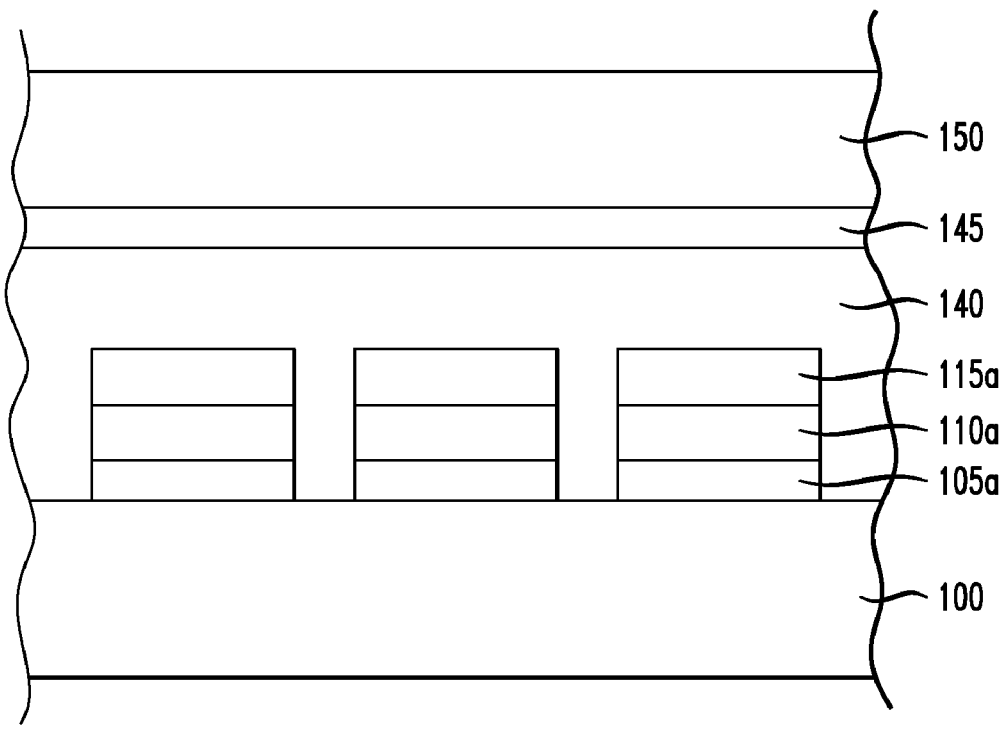

As shown in FIG. 2F, in embodiments the second photoresist structure includes a photoresist under-layer (UL) 140 (e.g., 4000 Å in thickness) deposited over the substrate 100 followed by a silicon-rich (e.g., 40% silicon) photoresist middle layer (ML) 145 (e.g., 430 Å in thickness). Finally, a top layer of photoresist (e.g., 750 Å) is deposited over the layer 145, exposed and developed to form a second patterned photoresist layer 150. This tri-layer photoresist approach (PR/ML/UL), the PR layer 150 need only be about 750 Å in order to open the 430 Å ML layer. With thicker PR layers, the lithography tool could not print the desired small line spacing. The ML layer serves as a hard mask layer to the thicker 4000 Å UL layer.

Figure 2G:
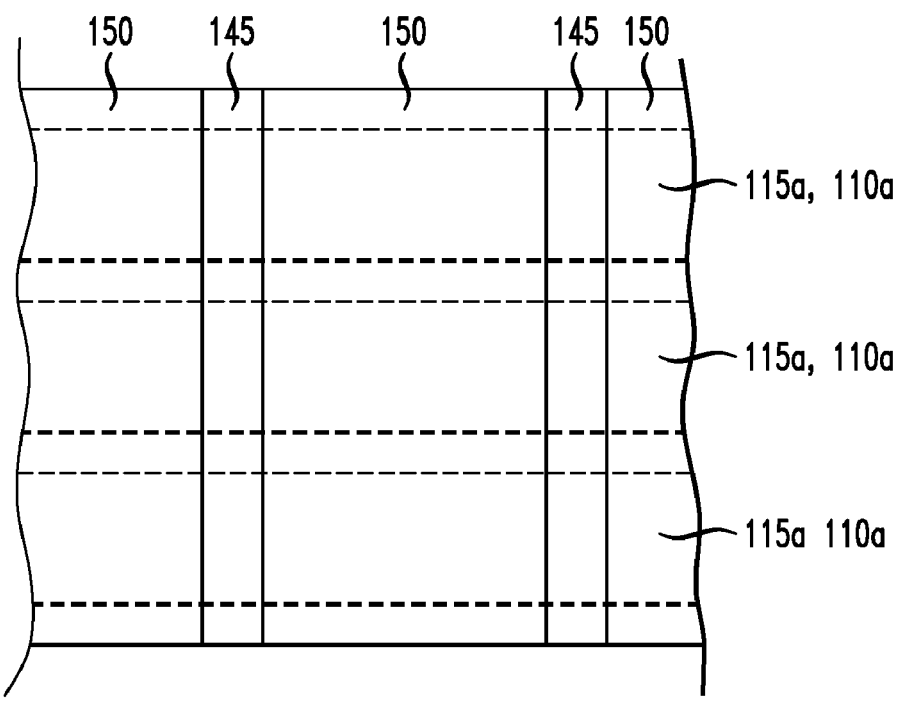

As can be seen from the top down view of FIG. 2G, the second patterned photoresist layer 150 extends across the etched hardmask layer lines 115a, 110a (illustrated in dashed form) to define exposed cut regions where the line ends of various line features of the hardmask will be formed.

Figure 2H:
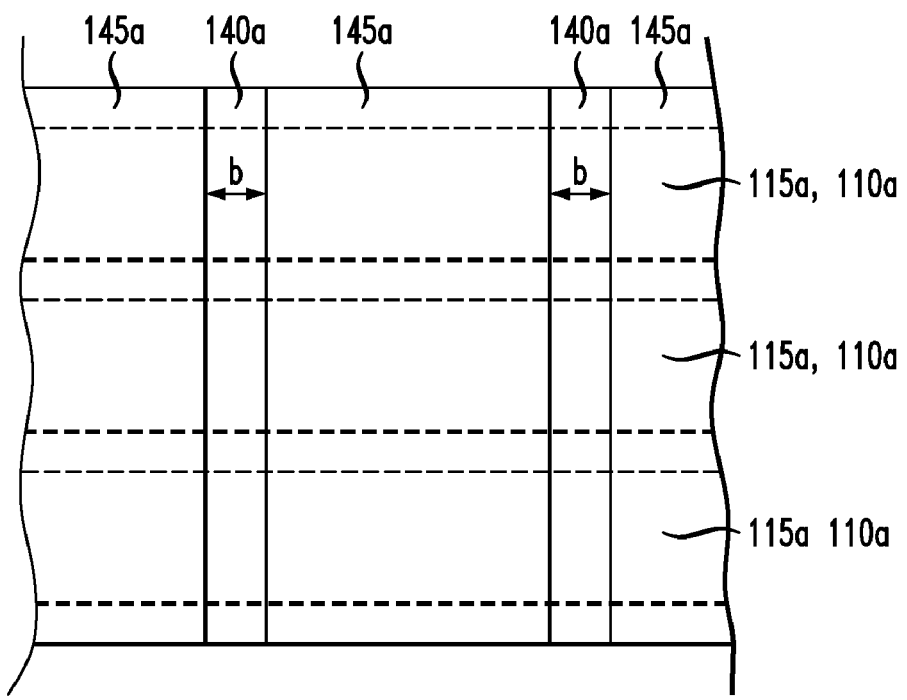
Figure 2I:
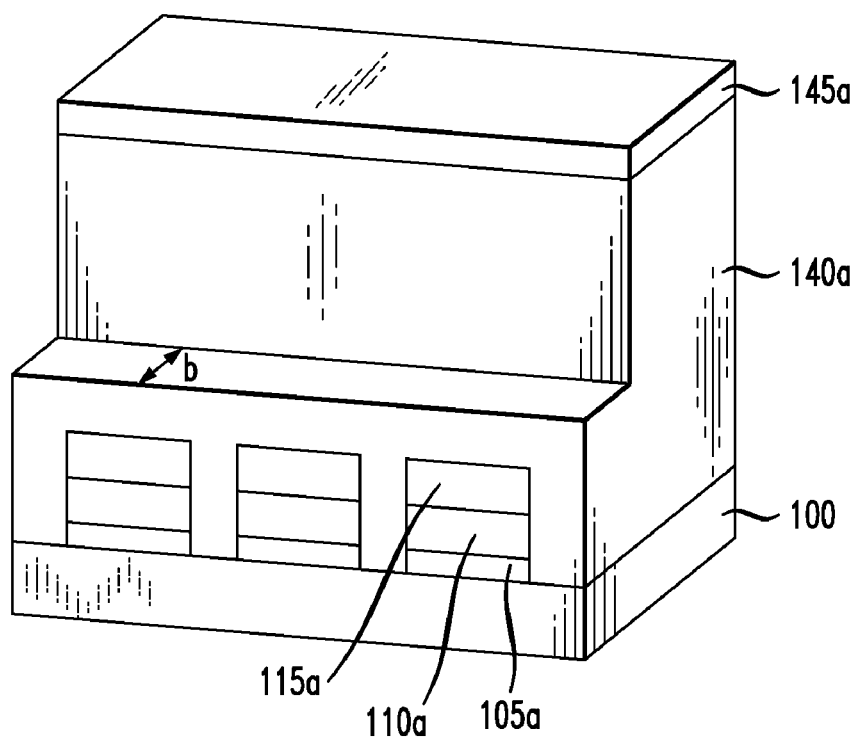

Referring to FIG. 2H, the pattern of the second photoresist layer 150 is etch transferred into the UL and ML layers 140, 145, leaving patterned UL and ML layers 140a, 145a, respectively. This etch step etches away the portions of ML layer 145a that are not protected by second patterned photoresist layer 150 and only partially through the unprotected portions of the UL layer 140. A partial three dimensional image illustrating this partially etched structure is shown in FIG. 2I, after stripping of photoresist layer 150.

Figure 2J:
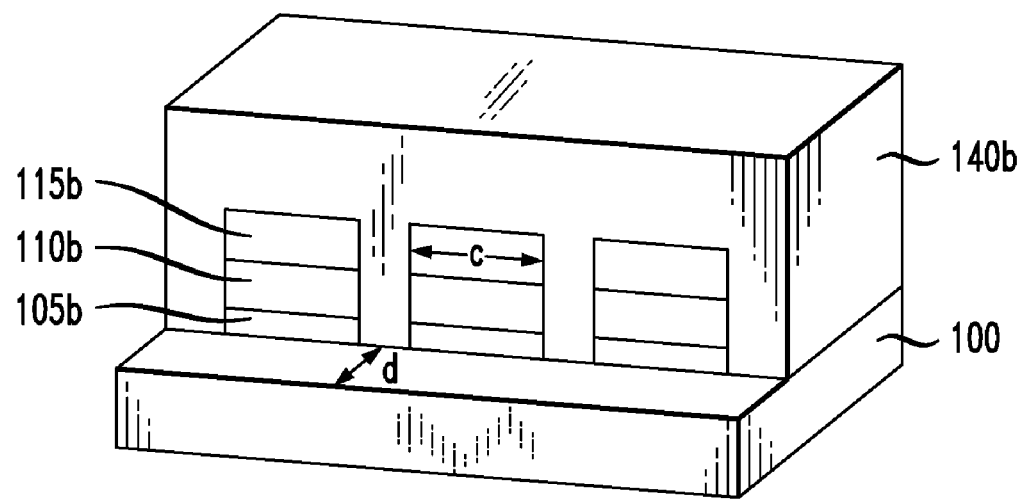

The ML layer 145a is then removed in a ML dry etch process and the etch process continues to etch completely through the thinner portions of UL layer 140a to the semiconductor substrate 100. In doing so, those portions of the hardmask layers 110a, 115a not protected by the thicker portions of layer 140a illustrated in FIG. 2I are removed to thus define the line ends of the various line features of the hardmask layer, while the remainder of the hardmask is protected by the thicker portions of the UL layer 140a. A partial three dimensional image of this structure is shown in FIG. 2J, which illustrates the portions of UL layer 140b remaining after the second hardmask etch and illustrates. As can be seen in FIG. 2J, the etch process cut through the interim hardmask layer 110a, 115a to form hardmask layers 110b, 115b having defined line ends spaced from one another a distance "d". The dry etch recipe preferably includes an ashing step that removes the remaining portions of UL 140b, leaving the structure shown in FIG. 2K.

Figure 2K:
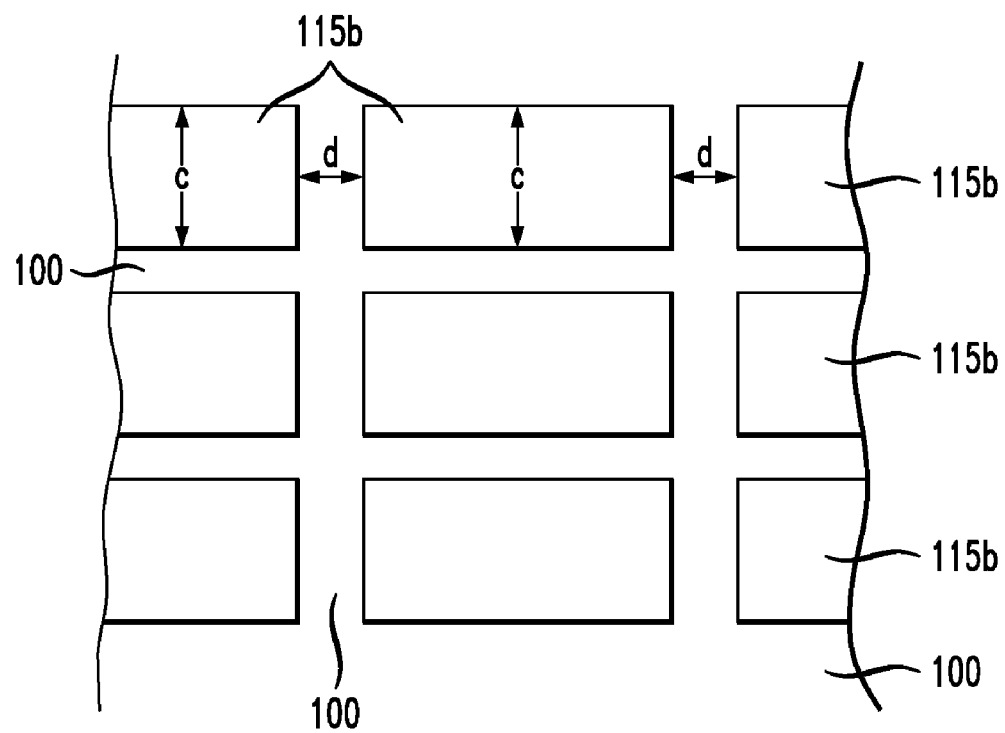

FIG. 2K is a top down view of the wafer structure after removal of the UL layer 140b, such as by an ashing process. As can be seen from FIG. 2K, each hardmask layer line has been cut to form multiple hardmask layer line segments spaced an after inspection (AEI) LE distance "d" from one another.

Figure 2L:
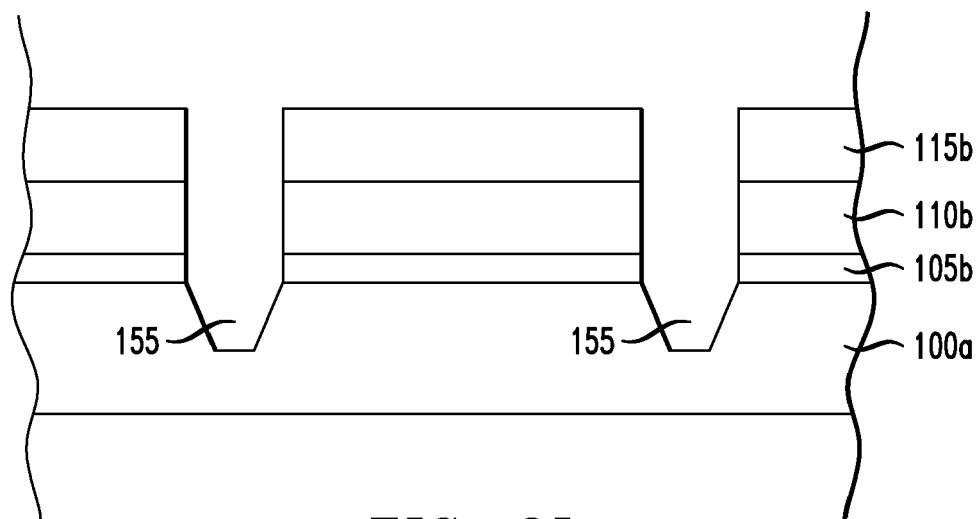

As shown in FIG. 2L, the patterned hardmask, which contains layers 110b and 115b, is then used as a mask for etching trenches 155 in substrate 100, resulting in etched substrate 100a. This etch step, i.e., etching the substrate 100, is preferably part of a continuous process that etches the hardmask layers, i.e., the hardmask dry etch process.

Figure 2M:
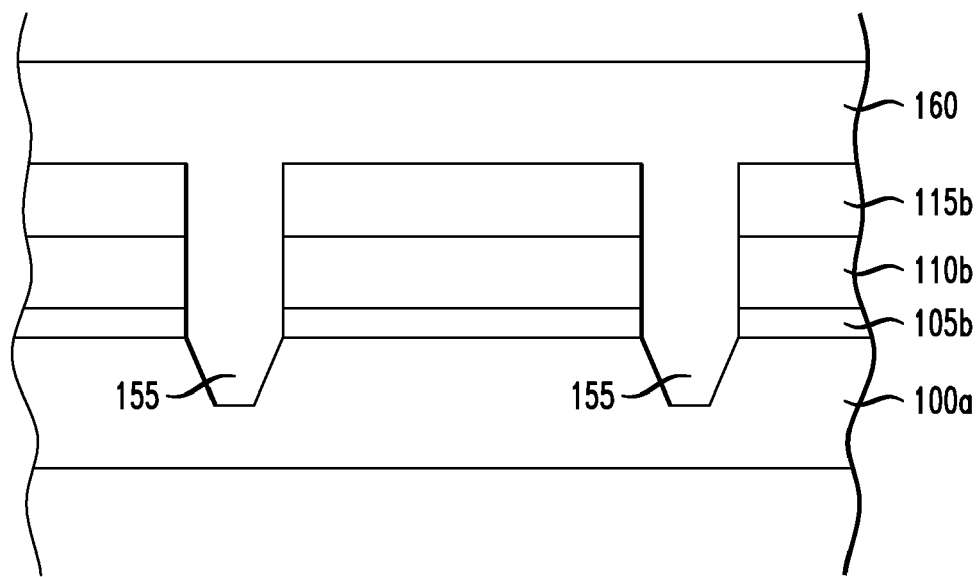

After etching the substrate to form trenches 155, a layer of insulating material 160, such as silicon dioxide, is then blanket deposited over the substrate 100a to fill trenches 155, as shown in FIG. 2M.

Figure 2N:
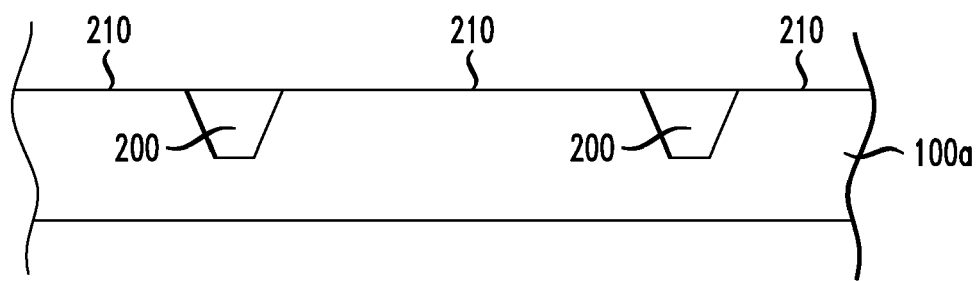

Finally, as shown in FIG. 2N, a polishing process, such as a CMP process, is employed to remove the excess insulator material 160, and hardmask layers 110b, 115b and part of the pad oxide layer 105b, leaving shallow trench isolations regions 200 in semiconductor substrate 100a, which define active regions 210.

Figure 3:
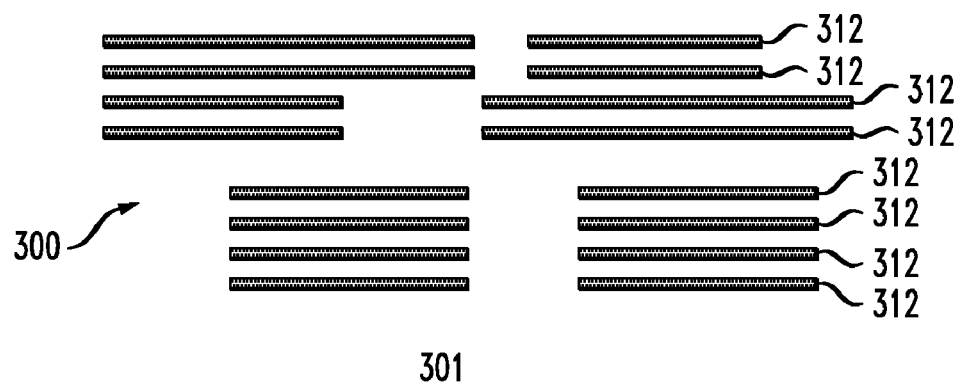
FIGS. 3-3D illustrate a method of forming a hard mask in accordance with an embodiment of the present invention.
Figure 3A:
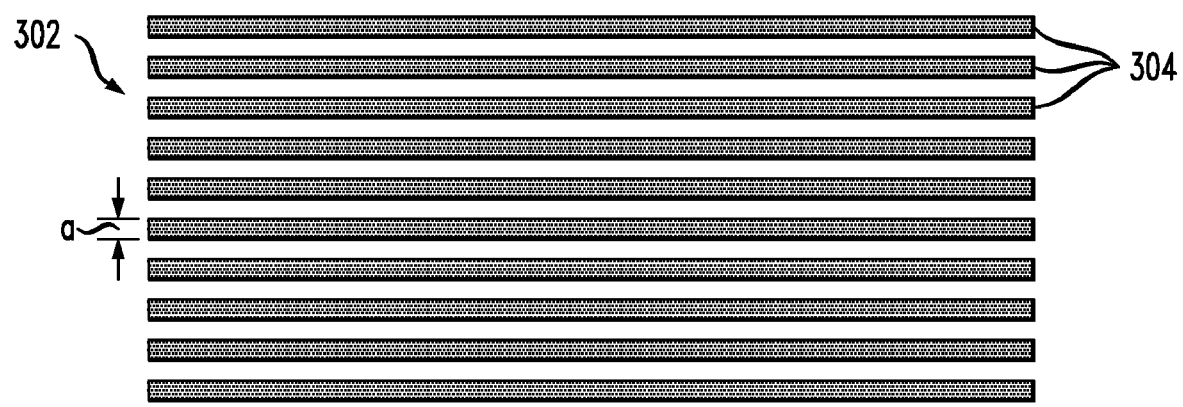
Figure 3B:
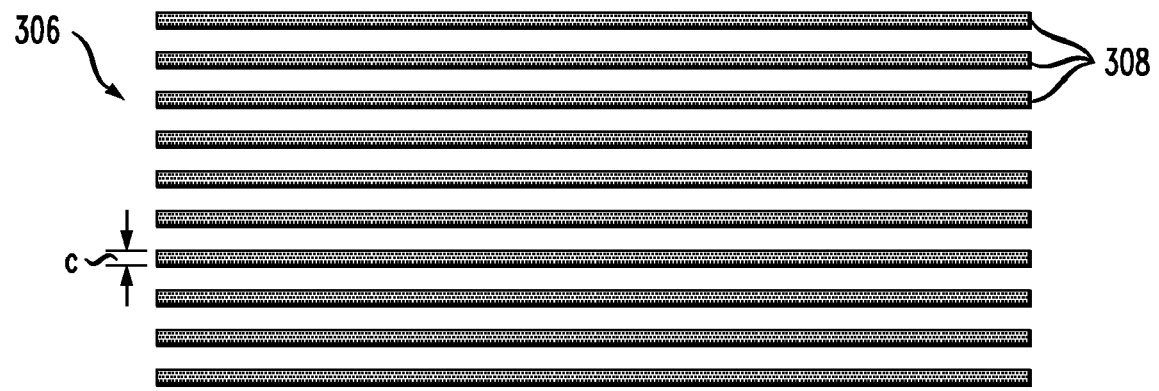
Figure 3C:
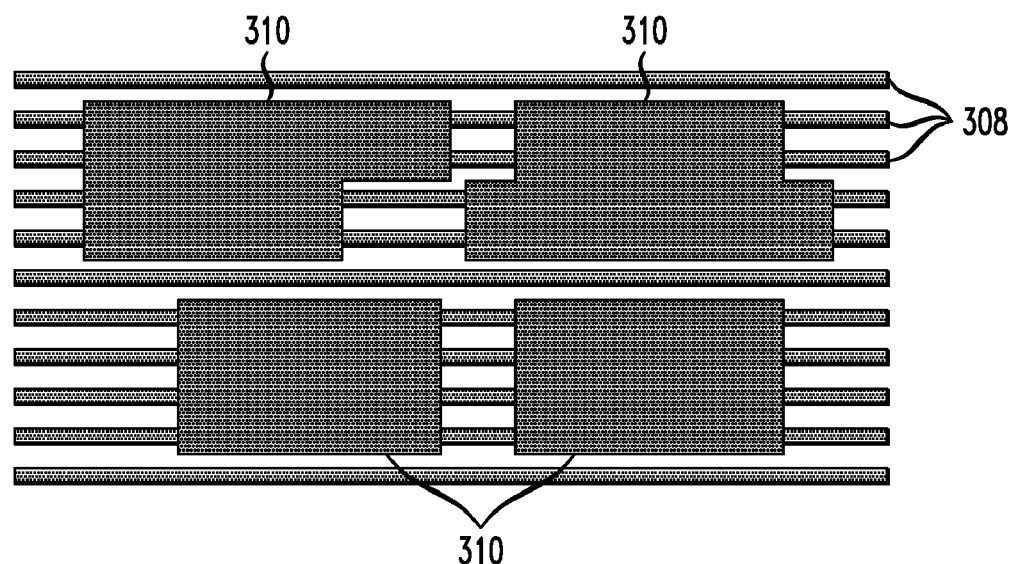
Figure 3D:
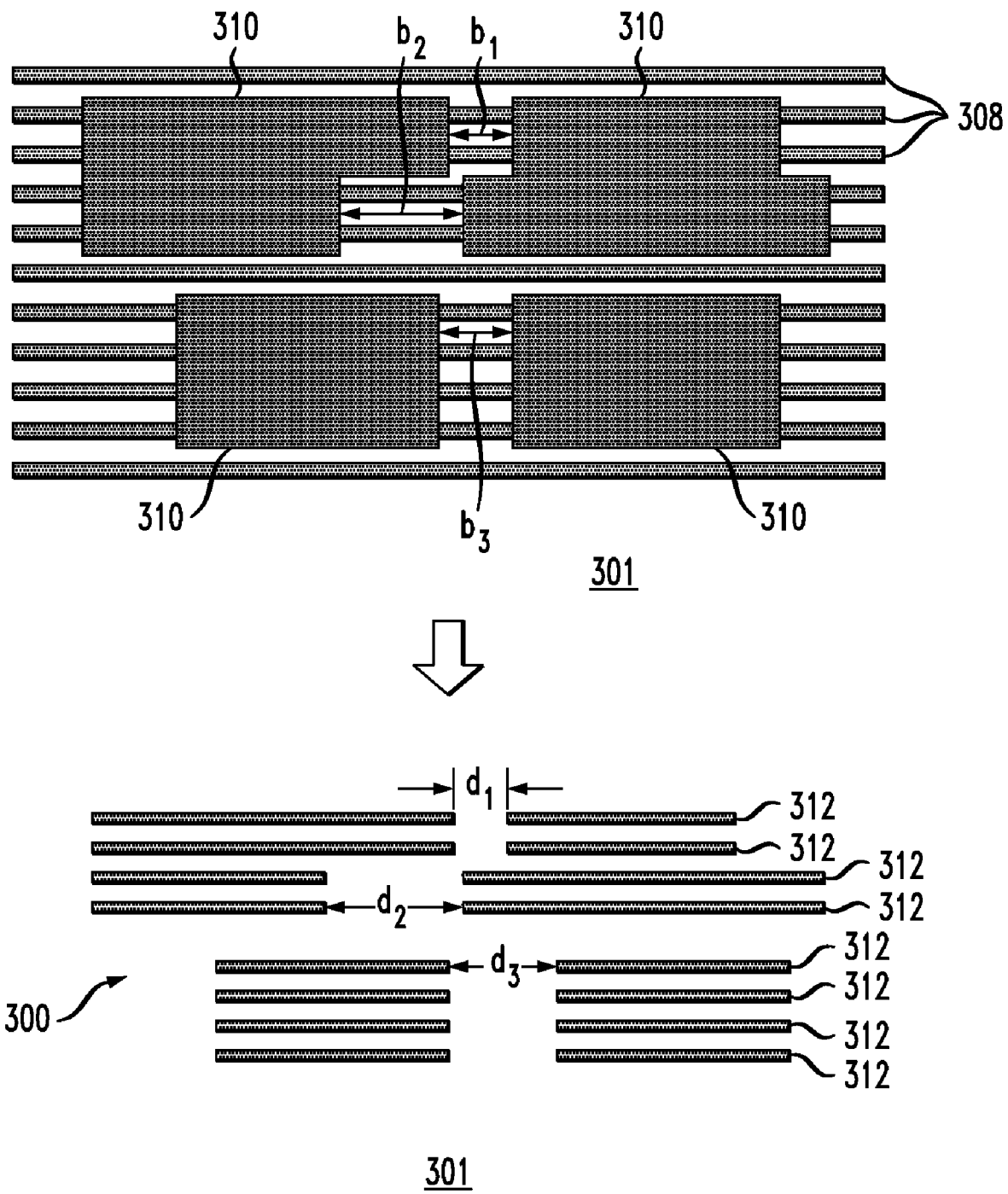

FIGS. 3-3D illustrate a method of forming a hard mask, such as for defining shallow-trench isolations. FIG. 3 is a top view of the desired hard mask pattern 300 for defining the shallow trench isolations regions in a substrate 301. The hard mask pattern includes a plurality of line segments 312. FIGS. 3A-3D illustrate the method of forming these line segments 312.

As shown in FIG. 3A, a photoresist pattern 302 is formed over the a layer of the hard mask material (not shown). The photoresist pattern includes a plurality of parallel lines 304 each having a width "a".

As shown in FIG. 3B, the hard mask material is etched through the photoresist pattern 302 to form hard mask pattern 306, which comprises a plurality of hard mask lines 308 each having a width "c" that is narrower than the width "a." This step defines the target width of the line features of the hard mask but not their ends.

As shown in FIG. 3C, a photoresist pattern including photoresist segments 310 is formed over the hard mask line features 308. The photoresist pattern corresponds to the desired pattern 300 shown in FIG. 3. That is, the photoresist pattern defines the regions of the hard mask line segments 308 that will be subsequently removed by an etch process, thus defining the line ends for the line segments shown in the hard mask pattern in FIG. 3.

FIG. 3D illustrates the etching of the hard mask line segments 308 through the photoresist segments 310. The etch process provides the resulting hard mask pattern 300 containing the desired line features 312. As can be seen from FIG. 3D. the photoresist segments 310 define line end spacings of $b_1$, $b_2$ and $b_3$, for example. The resulting line features have corresponding line end spacings of $d_1$, $d_2$ and $d_3$. By separately defining the line width (FIG. 3A, 3B) and line end features (FIG. 3C, 3D), the method affords great control over the line end bias (LE)-to-line side bias (LS) ratio of the hard mask line features. Not only can lower ratios be achieved (e.g., less than 1) if desired, but separately defining the line width (FIG. 3A, 3B) and line end features allows the ratio to be adjustable by adjusting the etch process used etching pattern 302 to form pattern 306, and/or used in etching pattern 308 to form pattern 300. For example, optical proximity correction (OPC) techniques could be used to adjust the line end shortening if desired. Or the etch parameters can be modified to provide different results. For example, the etchant gas (e.g., $CH_2F_2$, $CH_3F$, $CH_4$, $N_2$, etc.) can be selected based on the desired line end shortening results.

The method described above was tested. The results showed that the LE/LS ratio could be adjusted from 0.5 to 5 as desired which meets the newer technology generation, e.g., 22 nm design generation, LE/LS ratio target of less than 1

Although the method has been described above as defining the lines (FIGS. 2A to 2E, or 3A to 3B) before defining the line ends (FIGS. 2G to 2J, or 3C to 3D), the method may be modified such that the reverse order is applied. That is, the line ends could be defined prior to defining the spacing between individual lines. Still further, although the method has been described above in connection with depositing and patterning a first photoresist layer over a hardmask layer, and then etching the hardmask layer to form an interim hardmask layer, followed by depositing and patterning a second photoresist layer over the hardmask layer, followed by etching the interim hardmask layer, in embodiments, the discrete photoresist layers are deposited and patterned, followed by a single etching of the hardmask layer through the photoresist stack. For example, with reference to FIGS. 3-3D, the photoresist pattern 302 of FIG. 3A can be formed over the hardmask layer. Then, the photoresist pattern 310 can be formed over the photoresist pattern 302. Finally, this hardmask layer is etched through the stacked photoresist pattern to form the hardmask pattern 300 of FIGS. 3/3D.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a hardmask for defining shallow trench isolation regions in a semiconductor substrate layer, comprising the steps of:
   depositing a hardmask layer over the semiconductor substrate layer;
   depositing and patterning a first photoresist layer over the hardmask layer;
   etching the hardmask layer after patterning the first photoresist layer to form an interim hardmask layer having at least one line feature;
   depositing and patterning a second photoresist layer over the interim hardmask layer, thereby forming a patterned second photoresist layer; and forming a hardmask, the forming step including etching the interim hardmask layer after patterning the second photoresist layer to define a line end of the at least one line feature, wherein the patterned second photoresist layer has a first portion overlying regions of the interim hardmask layer to be etched in the hardmask forming step and a second portion overlying regions of the interim hardmask layer to be protected from etching during the hardmask forming step, the second portion being thicker than the first portion, and wherein the hardmask forming step comprises etching through the patterned second photoresist layer and the interim hardmask layer together.

2. The method of claim 1, further comprising the step of removing the first photoresist layer before depositing the second photoresist layer.

3. The method of claim 1, further comprising the steps of:
after etching the interim hardmask layer, etching the semiconductor substrate layer to form etched regions corresponding to shallow trench isolation (STI) regions; and
depositing a layer of oxide over the substrate, the layer of oxide filling the etched regions.

4. The method of claim 3, further comprising the step of performing a planarization process on the semiconductor substrate layer to define the STI regions.

5. The method of claim 3, further comprising the step of removing remaining portions of the patterned second photoresist layer before etching the semiconductor substrate layer.

6. The method of claim 1, wherein line end bias (LE)-to-line side bias (LS) ratio of the hardmask is less than 1.

7. The method of claim 1, wherein the step of etching the interim hardmask layer after patterning the second photoresist layer is characterized by a line end shortening of less than 5 nm.

8. The method of claim 1, wherein line end bias (LE)-to-line side bias (LS) ratio of the hardmask is adjustable.

9. The method of claim 8, wherein a line end shortening resulting from the step of etching the interim hardmask layer is adjusted by optical proximity correction techniques.

10. A method of forming shallow trench isolation (STI) regions in a semiconductor substrate layer, comprising the steps of:
depositing a hardmask layer over the semiconductor substrate layer;
forming a first photoresist layer over the hardmask layer, the first photoresist layer being patterned to define a plurality of lines;
etching the hardmask layer through the first photoresist layer to form an interim hardmask layer having a plurality of lines;
removing the first photoresist layer;
after removing the first photoresist layer, forming a second photoresist layer over the interim hardmask layer, the second photoresist layer defining line end cuts through the lines of the interim hardmask layer, wherein the second photoresist layer has a first portion overlying regions of the interim hardmask layer to be etched and a second portion overlying regions of the interim hardmask layer to be protected from etching, wherein the second portion is thicker than the first portion;
etching through the second photoresist layer and the interim hardmask layer together (cross-through) to form a hardmask, wherein line end bias (LE)-to-line side bias (LS) ratio of the hardmask is less than 1;
removing remaining portions of the second photoresist layer;

after removing the remaining portions of the second photoresist layer, etching the semiconductor substrate layer to form trenches in the semiconductor layer; and
filling the trenches with an insulating material.

11. The method of claim 9, wherein the step of etching the interim hardmask layer is characterized by a line end shortening of less than 5 nm.

12. A method of patterning a semiconductor wafer to form a shallow trench isolation(STI) structures comprising the steps of:
forming a hardmask layer over the semiconductor wafer;
depositing a first photoresist layer over the hardmask layer;
patterning the first photoresist layer;
etching the hardmask layer after patterning the first photoresist layer to define features in the hardmask layer having a defined linewidth, thereby forming interim hardmask layer;
after etching the hardmask layer, forming a second photoresist layer over the interim hardmask layer;
patterning the second photoresist layer, thereby forming a patterned second photoresist layer, wherein the patterned second photoresist layer has a first portion overlying regions of the interim hardmask layer to be etched and a second portion overlying regions of the interim hardmask layer to be protected from etching, wherein the second portion is thicker than the first portion; and
etching through the patterned second photoresist layer and the interim hardmask layer together (cross-through) to define line ends for the hardmask features.

13. The method of claim 12, further comprising the step of, after etching the interim hardmask layer to define features in the hardmask having the defined linewidth, etching the semiconductor wafer through the hardmask to form trench regions for the STI structure.

14. The method of claim 13, further comprising the step of removing remaining portions of the patterned second photoresist layer before etching the semiconductor substrate.

15. The method of claim 12, further comprising the step of removing the first photoresist layer after etching the hardmask layer to define features in the hardmask layer having the defined linewidth.

16. The method of claim 12, wherein line end bias (LE)-to-line side bias (LS) ratio of the hardmask features is less than 1.

17. The method of claim 12, wherein the step of etching the interim hardmask layer to define line ends for the hardmask features is characterized by a line end shortening of less than 5 nm.

18. The method of claim 17, wherein the line end (LE) bias-to-line side bias (LS) ratio of the hardmask features is less than 1.

19. The method of claim 12, wherein the patterned second photoresist layer overlaps and protects the sides of the hardmask features during the step of etching the interim hardmask layer to define line ends for the hardmask features.

20. A method of forming a hardmask for defining shallow trench isolation regions in a semiconductor substrate layer, comprising the steps of:
depositing a hardmask layer over the semiconductor substrate layer;
depositing and patterning a first photoresist layer over the hardmask layer;
etching the hardmask layer after patterning the first photoresist layer to form an interim hardmask layer having at least one line feature;
depositing and patterning a second photoresist layer over the interim hardmask layer, thereby forming a patterned second photoresist layer, wherein the patterned second photoresist layer has a first portion overlying regions of the interim hardmask layer to be etched and a second portion overlying regions of the interim hardmask layer to be protected from etching, wherein the second portion is thicker than the first portion; and forming a hardmask, the forming step including etching through the patterned second photoresist layer and the interim hardmask layer together (cross-through) to define a line end of the at least one line feature.

* * * * *

UNITED STATES PATENT AND TRADEMARK OFFICE
CERTIFICATE OF CORRECTION

| | | |
|---|---|---|
| PATENT NO. | : 8,048,764 B2 | Page 1 of 1 |
| APPLICATION NO. | : 12/570926 | |
| DATED | : November 1, 2011 | |
| INVENTOR(S) | : Ming-Jie Huang et al. | |

It is certified that error appears in the above-identified patent and that said Letters Patent is hereby corrected as shown below:

IN THE CLAIMS:

Column 8, Claim 12, Line 16, insert -- an -- in between "forming" and "interim"

Signed and Sealed this
Seventeenth Day of January, 2012

David J. Kappos
*Director of the United States Patent and Trademark Office*